United States Patent [19]

Sirocka et al.

[11] 3,942,043

[45] Mar. 2, 1976

[54] ELECTRONIC WATCH

[75] Inventors: Richard L. Sirocka; David F. Broxterman, both of Sunnyvale, Calif.

[73] Assignee: Fairchild Camera and Instrument Corporation, Mountain View, Calif.

[22] Filed: May 9, 1974

[21] Appl. No.: 468,304

Related U.S. Application Data

[62] Division of Ser. No. 320,223, Jan. 2, 1973, Pat. No. 3,815,354.

[52] U.S. Cl. .................. 307/279; 307/264; 307/288; 307/313; 307/DIG. 1
[51] Int. Cl.² ........................................ H03K 3/286
[58] Field of Search .......... 307/205, 279, 288, 313, 307/DIG. 1, 264

[56] References Cited
UNITED STATES PATENTS
3,636,530  1/1972  Mark et al. ..................... 307/279 X

*Primary Examiner*—John Zazworsky
*Attorney, Agent, or Firm*—Alan H. MacPherson; Henry K. Woodward; J. Ronald Richbourg

[57] ABSTRACT

A C MOS level converter for converting low voltage control signals to equivalent control signals of a relatively high voltage which operates with extremely low power consumption. The level converter has first and second pairs of P-type MOS transistors coupled source to source and drain to drain, the commonly connected sources of each pair being coupled to ground potential and the gate of each outer transistor of each pair being coupled to low voltage control signals of opposite phase. The gate of each inner transistor of each pair is coupled to the common drain terminal of the other pair, and the common drain terminal of each pair is coupled to the drain terminal of a different one of a pair of N-type MOS transistors. The gate of each N-type transistor is coupled to the gate of the associated inner transistor of the first and second pairs. A separate constant current source is coupled to each N-type MOS transistor and to a source of relatively high voltage and a biasing voltage for permanently biasing each constant current source in the conducting state.

1 Claim, 3 Drawing Figures

ELECTRONIC WATCH

CROSS REFERENCE TO RELATED CASES

This application is a divisional of commonly assigned patent application, Ser. No. 320,223, filed Jan. 2, 1973 for "ELECTRONIC WATCH", now Pat. No. 3,815,354, the disclosure of which is hereby incorporated by reference.

BACKGROUND OF THE INVENTION

This invention is directed to a level converter for use in the electronic watch disclosed in the above referenced patent application. The referenced electronic watch is designed to consume extremely small amounts of electrical power during operation so that the useful lifetime of a battery power source is considerably prolonged over conventional electronic watches. The watch is composed of electronic circuits which are operated at a relatively low voltage, e.g. 1.5 volts DC, and other electronic circuits which are operated at a relatively high voltage, e.g. approximately 15 volts DC. The low voltage portion circuitry generates low voltage control signals which must be converted to relatively high voltage control signals in order to drive a liquid crystal time display.

SUMMARY OF THE INVENTION

This invention comprises a level converter for converting relatively low level control signals to relatively high level control signals for driving a liquid crystal digital display. In ths preferred embodiment, the level converter comprises C MOS electronic circuitry including a control input for receiving low level control signals, an output terminal for manifesting relatively high level control signals, an input terminal adapted to be coupled to a source of relatively high voltage, and means switchable between opposite states in response to the appearance of the relatively low level control signal at the control input for coupling the input terminal to the output terminal, the coupling means being configured to require significant amounts of current only during switching.

For a fuller understanding of the nature and advantages of the invention, reference should be had to the ensuing detailed description taken in conjunction with the accompanying drawings.

DESCRIPTION OF THE PREFERRED EMBODIMENT

Figure 1:
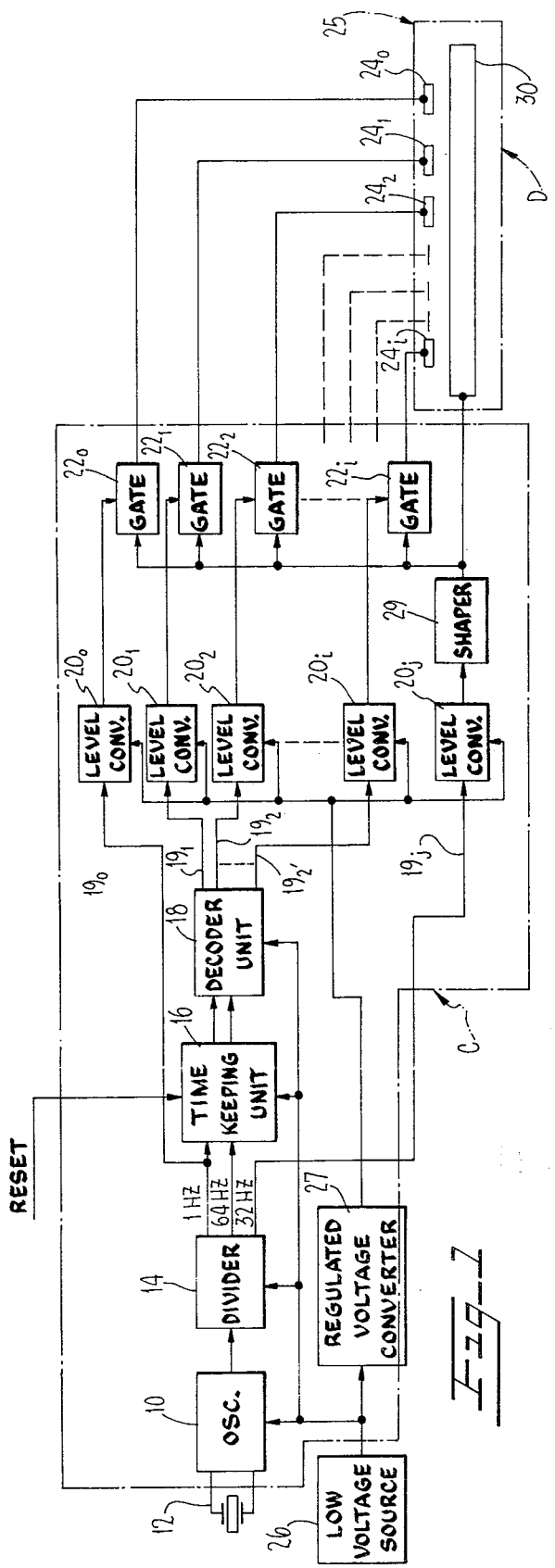
FIG. 1 is a system diagram illustrating the electronic watch.

Turning now to the drawings, FIG. 1 illustrates an electronic watch embodying the invention. An oscillator 10 having a control crystal 12 provides a train of high frequency reference pulses preferably at a frequency of 32,768 HZ to the input of a frequency divider circuit 14. Frequency divider circuit 14 divides the high frequency reference signal down to 64 HZ, 32 HZ and 1 HZ reference signals. The 64 HZ and 1 HZ reference signals are coupled to the input of a time keeping unit 16, which provides output signals representative of minutes and hours to a decoder unit 18.

Decoder unit 18 is provided with a plurality of output leads $19_1$–$19_i$ each coupled to a low voltage control input terminal of a different level converter $20_1$–$20_i$. It is noted that the 1 HZ output signal from divider 14 is also coupled directly to a level converter $20_0$.

The output of each level converter $20_1$–$20_i$ is coupled to the control input of a different transfer gate $22_1$–$22_i$. The output of each transfer gate $22_1$–$22_i$ is a high level signal for enabling a different one of a plurality of display segment control electrodes $24_1$–$24_i$ of a liquid crystal display 25.

In the preferred embodiment, liquid crystal display 25 is arranged as a plurality of conventional 7 segment digital display characters. By selectively actuating different combinations of the individual segments, the decimal digits 0–9 may be displayed. In the preferred embodiment two such characters are used for indicating minutes and two characters are used for indicating hours. A special segment $24_0$ is pulsed at a 1 second rate by the 1 HZ signal on lead $19_0$ to provide a visual indication to the wearer that the electronic watch is functioning properly. The structure and operation of liquid crystal displays are well known and further structural details of display 25 are accordingly omitted to avoid prolixity. Such displays are characterized by relatively low current comsumption compared to light emitting diode displays or other known types of displays suitable for use as time indicators. However, for proper operation a liquid crystal display requires the application of a relatively high enabling potential between a given segment $24_i$ and the common electrode 30. Moreover, this relatively high enabling potential is preferably applied in an A.C. mode as described below in order to prolong the life of the display.

As will be apparent, the number of level converters $20_0$–$20_i$, transfer gates $22_0$–$22_i$ and display segment control electrodes $24_0$–$24_i$ is determined by the number of desired reference characters and the number of segments per character. To avoid needless repetition, the majority of such elements have been indicated in the FIG. 1 diagram by broken lines.

A low voltage source 26 providing a source voltage $V_D$ of approximately 1.5 volts DC in the preferred embodiment is coupled to the supply voltage input of oscillator 10, divider unit 14, time keeping unit 16 and decoder unit 18. Low voltage source 26 is also coupled to a regulated voltage converter 27 which converts the relatively low voltage from source 26 to a relatively high voltage of the order of approximately 15 volts DC in the preferred embodiment. The output from regulated voltage converter 27 is coupled to the supply voltage input of level converters $20_0$–$20_i$, a level converter $20_j$ and a shaper 29. the high level output of the shaper 29 is coupled to the transfer inputs of transfer gates $22_0$–$22_i$ and to common electrode 30 of liquid crystal display 25.

As will now be apparent, oscillator 10, divider 14, time keeping unit 16 and decoder 18 are all powered by the relatively low voltage $V_D$ from source 26. Since these units are all well known to those skilled in the art their details have been omitted to avoid prolixity. These units are preferably implemented by CMOS circuitry. As will be evident to those skilled in the art, circuits designed in accordance with the principles of CMOS (complementary metal oxide semiconductor) technology utilize opposite conductivity type transistors arranged in such a manner that current is only drawn during extremely small switching periods. Thus, such circuits require extremely small amounts of current for proper operation. In addition, such circuits can readily be designed to function properly from extremely low supply voltage. Thus, low voltage source 26 may comprise any one of a number of commercially available 1.5 volt DC batteries.

In operation, the train of high frequency reference pulses from oscillator 10 is divided down by divider 14 to the 64 Hz, 32 Hz and 1 Hz time reference signals. The 1 Hz reference signals are applied to timekeeping unit 16 which provides a minutes and hours count in response thereto. The minutes and hours signals from time keeping unit 16 are decoded by decoder unit 18 into low level signals on leads $19_1$–$19_i$ for specifying the individual segments $24_1$–$24_i$ of liquid crystal display 25 which are to be actuated in order to provide a visual time indication. The low level 1 Hz reference signals on lead $19_0$ are also utilized to specify the actuation of seconds segment $24_0$ of liquid crystal display 25.

Level converters $20_0$–$20_i$ and $20_j$, transfer gates $22_0$–$22_i$ and shaper 29 are all operated at a relatively high potential $V_D$, provided by regulated voltage converter 27. Level converters $20_0$–$20_i$ convert the low level control signals at their respective inputs $19_0$–$19_i$ to high level control signals for operating transfer gates $22_0$–$22_i$. Level converter $20_j$ converts the low level 32 Hz control signal present on input lead $19_j$ to high level 32 Hz signals. These high level signals from level converter $20_j$ are shaped by shaper 29 to provide high level 32 Hz segment actuation signals with sharply defined leading and trailing edges. The segment actuation signals are coupled through transfer gates $22_0$–$22_i$ to segments $24_0$–$24_i$ and directly to common electrode 30 of liquid crystal display 25. As more fully described below in connection with FIGS. 7 and 8, transfer gates $22_0$–$22_i$ control the phase of the segment actuation signals coupled therethrough with reference to the phase of the segment actuation signal coupled directly to common electrode 30. When the segment actuation signals on a given segment $24_i$ and common electrode 30 are in phase, that segment is not displayed; when segment actuation signals are out of phase that segment is actuated. Thus, various segments of the minutes and hours digit characters are displayed or not depending on the low level output signals on leads $19_1$–$19_i$ from decoder unit 18. In this manner, the various digits indicating minutes and hours are displayed.

An important feature of the watch shown in FIG. 1 resides in the operation of the time keeping system comprising oscillator 10, divider unit 14, time keeping unit 16 and decoder unit 18 at the low voltage level $V_D$ provided by source 26 and the operation of the level converters $20_0$–$20_i$, $20_j$, transfer gates $22_0$–$22_i$ and shaper 29 at the high voltage level $V_D'$ provided by regulated voltage converter 27. Because of the low voltage operation of the time keeping system and the use of complementary semiconductor circuitry, the power consumption of the continuously operating time keeping system is held to a minimum. Because of the complementary semiconductor circuit configuration of the high level operated level converters $20_0$–$20_i$, $20_j$, gates $22_0$–$22_i$ and shaper 29, power consumption of this relatively high voltage portion of the preferred embodiment is also held to a minimum.

Figure 2:
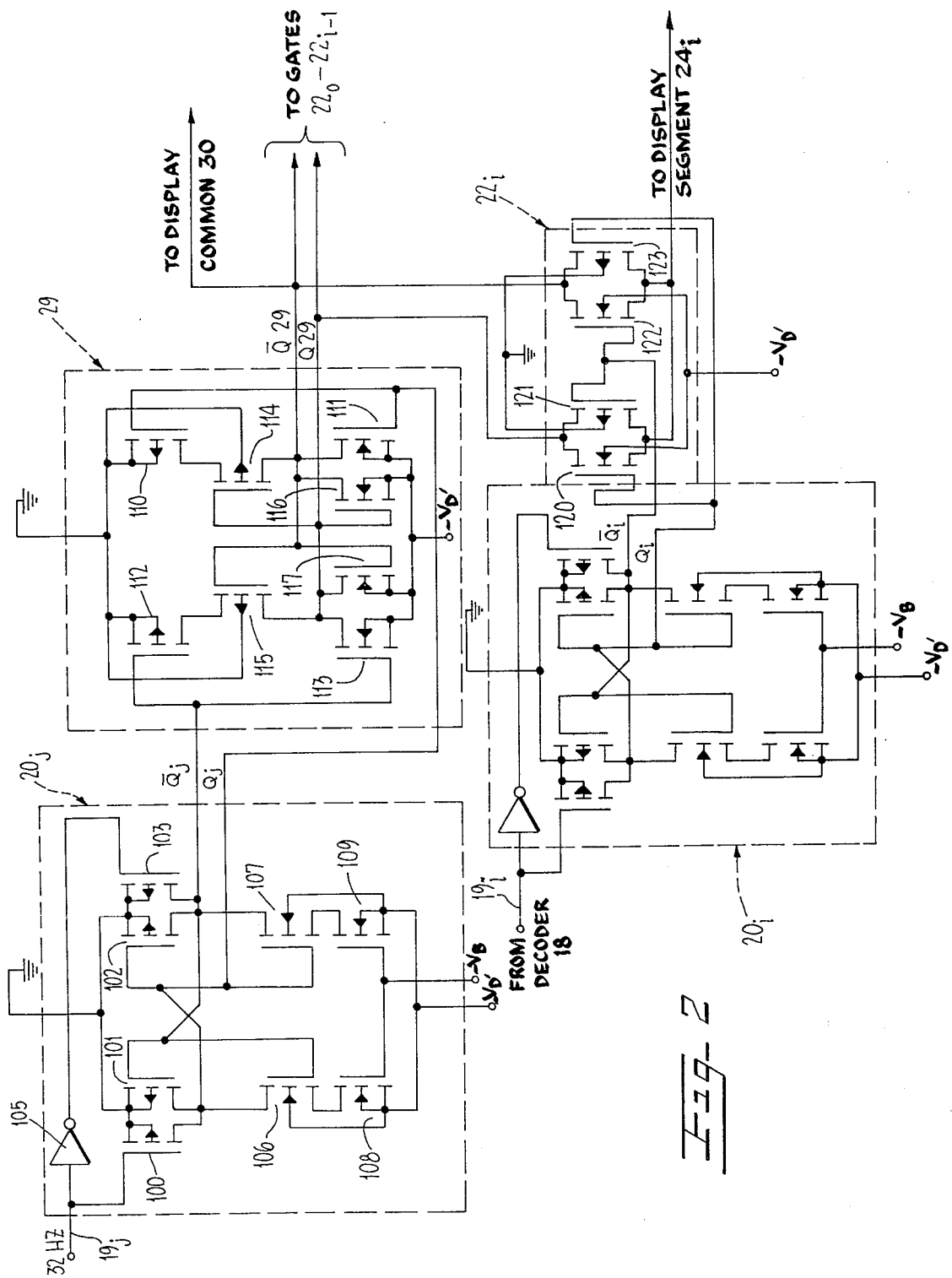
FIG. 2 is a circuit diagram showing the preferred embodiment of the invention.

FIG. 2 illustrates the actual circuitry employed in the preferred embodiment for implementing level converter $20_j$, shaper 29 and level converter $20_i$ and transfer gate $22_i$, the latter circuitry being typical of level converters $20_1$–$20_i$ and transfer gates $22_1$–$22_i$. In this Fig. the elements comprising the various blocks shown in FIG. 1 are enclosed in broken rectangles bearing the same reference numbral.

Level converter $20_j$ includes a first and second pair of P-type MOS transistors 100, 101 and 102, 103, respectively, each pair being connected source-to-source and drain-to-drain as shown. The commonly-connected sources of each pair are coupled to ground potential. The gate of each inner transistor of each pair is coupled to the common drain terminal of the other pair. The gate inputs to outer transistors 100,103 are the 32 Hz reference signals on lead $19_j$ from divider 14 of FIG. 1 and the output of an inverter 105, respectively. The common drain terminal of each pair is coupled to the drain terminal of a different N-type MOS transistor 106,107 respectively. The gate of each transistor 106,107 is coupled to the gate of the associated inner transistor 101,102 respectively. A constant current source comprising an N-type MOS transistor 108 having relatively high voltage $V_D'$ coupled to the source terminal thereof and biasing voltage $V_B$ coupled to the gate thereof in order to permanently bias transistor 108 on is provided in the left main branch of level converter $20_j$. An identically configured constant current source comprising N-type MOS transistor 109 is provided in the right branch of level converter $20_j$.

In operation, with enabling voltages $V_D'$ and $V_B$ applied to transistors 108,109 and the low level input signal on terminal $19_j$ at the true level, transistor 100 is biased off. The inverted input signal from inverter 105 is false and transistor 103 is thus biased on. $\overline{Q}_j$ is thus at ground potential and biases transistor 101 off and transistor 106 on. Since transistor 106 is biased on by $\overline{Q}_j$ and transistor 108 is biased on by voltage $V_B$, $Q_j$ is at voltage $V_D'$. $Q_j$ at voltage $V_D'$ biases transistor 102 on and transistor 107 off.

When the low level input signal on terminal $19_j$ transitions false, transistor 100 is biased on and transistor 103 is biased off. Since transistor 100 is now on, the voltage at $Q_j$ rises to ground potential, turning transistor 102 off and transistor 107 on. As transistor 102 is biased off, the voltage at $\overline{Q}_j$ falls to $V_D'$, biasing transistor 101 on and transistor 106 off. The circuit remains latched in this state until the input signal on lead $19_j$ transitions true.

When the low level input signal on lead $19_j$ transitions true, transistor 100 is biased off and transistor 103 is biased on. As transistor 103 is biased on, the voltage at $\overline{Q}_j$ rises to ground potential, biasing transistor 101 off and transistor 106 on. As transistor 106 is biased on, the voltage at $Q_j$ falls to $V_D'$, biasing transistor 102 on and transistor 107 off. The circuit remains latched in this state until the input signal on lead $19_j$ again transitions false. Further operation of level converter $20_j$ proceeds as already described.

As will now be apparent, level converter $20_j$ provides a pair of oppositely phased output signals on terminals $Q_j$, $\overline{Q}_j$ which range in magnitude between a negative voltage $V_D'$ having a relatively high magnitude and ground potential in response to an input signal on lead $19_j$ which ranges in magnitude between a negative voltage $V_D$ having a relatively low magnitude and ground potential. As noted above, in the preferred embodiment the range on the magnitude of the input signal is approximately 0–1.5 volts DC while the range on the magnitude of the output signal is approximately 0–15.0 volts DC. Thus, level converter $20_j$, as well as level converters $20_1$–$20_i$, permit the low voltage portion of the electronic time keeping system to control the relatively high voltage display. It is important to note that level converter $20_j$ draws current only during the extremely short transitional periods when the circuit is being switched between opposite latched states, due to the complementary configuration of the circuit. Thus, the current consumption of level converter $20_j$ is extremely small and discontinuous, being of the order of 1 microamp when switching.

The output signals from level converter $20_j$ on leads $Q_j$ and $\overline{Q_j}$ are coupled to the control gate of complementary MOS transistors 110, 111, 112, 113, respectively, of shaper 29. Shaper 29 comprises a CMOS set-reset flip-flop which is used to steepen the leading and trailing edges of the output signal pulses from level converter $20_j$. As illustrated by wave forms B and C of FIG. 8, the output signals on terminals $Q_{29}$, $\overline{Q_{29}}$ of shaper 29 comprise a pair of oppositely phased 32 Hz square wave pulse trains ranging in magnitude between voltage $V_D'$ and ground potential. The output signal on $\overline{Q_{29}}$ is coupled directly to common electrode 30 of liquid crystal display 25. The ouptut signals on $Q_{29}$ and $\overline{Q_{29}}$ are coupled to transmission gates $22_0$–$22_i$, only one of which is shown in FIG. 7.

Transmission gate $22_i$ comprises two pair of parallel connected CMOS transistors 120, 121 and 122, 123 respectively. The gates of CMOS transistors 121,122 are commonly connected to the $\overline{Q_i}$ output terminal of level converter $20_i$. Similarly, the gates of CMOS transistors 120, 123 are commonly connected to the $Q_i$ output terminal of level converter $20_i$. Whenever the output signal on $Q_i$ is high (ground potential) and the output signal on $\overline{Q_i}$ is low ($V_D'$) transistors 120 and 121 are biased on and the signal on $Q_{29}$ is transmitted to display segment $24_i$. Conversely, whenever the output signal on $\overline{Q_i}$ is high and the output signal of $Q_i$ is low, transistors 122 and 123 are biased on and the signal of $\overline{Q_{29}}$ is transmitted to display segment $24_i$.

Level converter $20_i$ is substantially identical in configuration to above-described level converter $20_j$. The input signal to level converter $20_i$, however, is a relatively low frequency time control signal from decoder unit 18, it being remembered that the control signals change at the maximum rate of 1 per minute for segments representing the units minutes characters and the minimum rate of 1 per 12 hours for segments representing the tens hours character. Due to the relatively low frequency of the control signals applied to level converter $20_i$, it is not necessary to shape the output signals from this element present on terminals $Q_i$, $\overline{Q_i}$.

Figure 3:
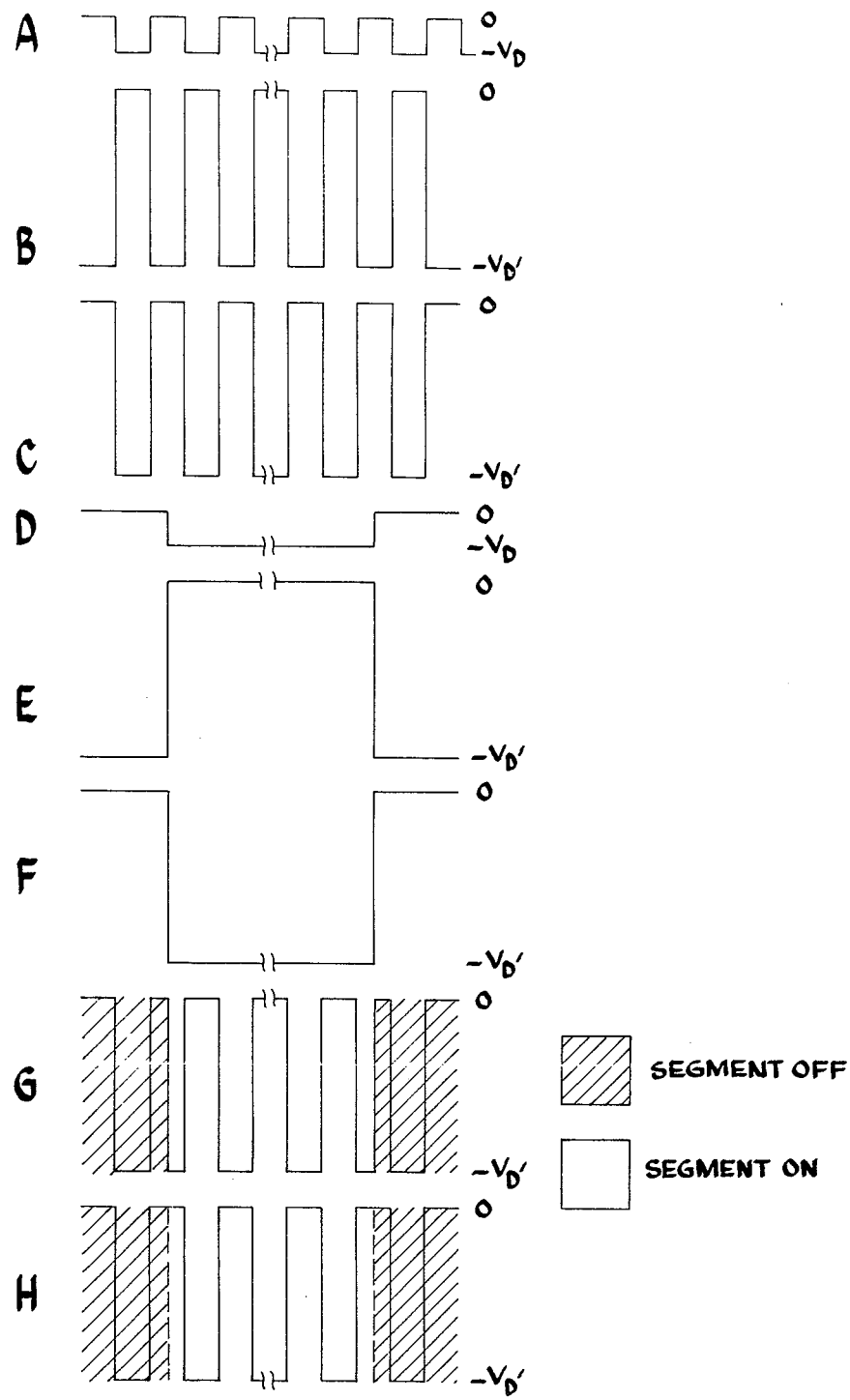
FIG. 3 is a waveform diagram illustrating the operation of the preferred embodiment.

The output signals from level converter $20_i$ control the phase of the commutated square wave signal applied to display segment $24_i$ relative to the phase of the commutated square wave signal applied to common electrode 30. This is best illustrated with reference to FIG. 3. Wave form A represents the relatively low level 32 Hz square wave input signal to level converter $20_j$ present on lead $19_j$. Wave forms B and C illustrate the 32 Hz relatively high level output signals from shaper 29 present on output terminals $Q_{29}$, $\overline{Q_{29}}$ respectively. Wave form D illustrates the relatively low level control signal to level converter $20_i$ present on lead $19_i$. Wave forms E and F represent the relatively high level output signal from level converter $20_i$ present on the output terminals $Q_i$ and $\overline{Q_i}$ respectively. Wave form G illustrates the output signal from transfer gate $22_i$ coupled to display segment $24_i$. Wave form H illustrates the signal from terminal $\overline{Q_{29}}$ coupled to common electrode 30 of liquid crystal display 25. For economy of space all of the above wave forms are represented in abbreviated form indicated by the broken central portion.

When wave forms G and H are in phase, the potential difference between display segment $24_i$ and common electrode 30 is zero and the segment $24_i$ is off. Conversely, when wave forms G and H are out of phase a striking potential is established between segment $24_i$ and common electrode 30 and segment $24_i$ is on. The relative phase of wave forms G and H is determined by control wave form D. When this control signal is true, wave forms E and F are false and true respectively, and wave form G follows wave form H. When wave form D is false wave forms E and F are true and false, respectively, and wave form G is oppositely phased from wave form H. Thus, with segment $24_i$ initially off, indicated by the hatched area, when wave form D transitions false segment $24_i$ is turned on as indicated by the unhatched area. When wave form D again transitions true, segment $24_i$ is again turned off.

In the preferred embodiment, each segment $24_i$ is operated in an A.C. mode by reversing the direction of the potential between the segment and common electrode 30 at the arbitrary rate of 32 Hz. This mode of operation of all character segments is utilized in order to prolong the life of liquid crystal display 25. When the preferred embodiment is used to drive other types of relatively high voltage display devices, A.C. operation may not be required for efficient operation. In such applications, the display segments 24 and common electrode 30 may be driven directly by level converters $20_0$–$20_i$ and level converter $20_j$, transmission gates $22_0$–$22_i$, and shaper 29 may be omitted.

The entire electronic time keeping and display system disclosed herein can be virtually fabricated from a single intergrated circuit chip, the outline of which is outlined in FIG. 1 by the phantom-lined border indicated by reference character C. As indicated by this Fig., the only components which are not included in the single integrated circuit chip are oscillator crystal 12, low voltage source 26, which must be removable when exhausted, and a portion of regulated voltage converter 27.k With reference to FIG. 6, those elements of regulated voltage converter 26 which are not housed on the single integrated circuit chip, also outlined in phantom in this Fig., are resistor 42 and the discreet elements of voltage converter 44: viz, transistor 52, inductor 53, diode 54 and capacitor 55. Thus, only seven circuit elements — one of which must be readily replacable — are carried externally of the single integrated circuit chip. As will be evident to those skilled in the art, this enables the electronic time keeping system of the invention to be fabricated and assembled at an extremely low cost.

Referring again to FIG. 1, liquid crystal display 25 comprises a separate physical package, indicated by the phantom-lined border D, from the integrated circuit chip, and may be arranged relative thereto in any convenient manner.

As will now be evident to those skilled in the art, the level converters utilized in the electronic time keeping system enable the low voltage time control signals to control the operation of the high voltage display without consuming great quantities of current, thereby contributing to the efficient low power operation of the entire system.

While the above provides a full and complete disclosure of the preferred embodiment of the invention, various modifications, alternate constructions and equivalents may be employed without departing from the true spirit and scope of the invention. Therefore, the above description and illustrations should not be construed as limiting the scope of the invention which is solely defined by the appended claims.

What is claimed is:

1. A complimentarily configured bi-stable circuit for converting a relatively low level control signal to a relatively high level control signal comprising:

a control input for receiving said low level control signal;

an output terminal for manifesting said relatively high level control signal;

an input terminal adapted to be coupled to a source of relatively high voltage; and means switchable between opposite states in response to the appearance of said relatively low level control signal at said control input for coupling said input terminal to said output terminal, said coupling means comprising first and second pairs of parallel connected transistors of a first conductivity type, the commonly coupled sources of said transistors coupled to a reference potential, the gate of a first transistor of said first pair coupled to said control input; an inverter having an input coupled to said control input and an output, the gate of the first transistor of said second pair coupled to said inverter output, the commonly coupled drain of said second pair of transistors coupled to said output terminal; first and second transistors of opposite conductivity type to said first type coupled to the commonly connected drains of a different one of said first and second pairs, the gate of said first opposite conductivity type transistor coupled to the gate of a second transistor of said first pair, the gate of said second opposite conductivity type transistor coupled to the gate of a second transistor of said second pair, the commonly coupled gates coupled to the commonly coupled drains of the opposite pair of said first conductivity type transistors; and first and second constant current sources each comprising a conductively biased transistor of said opposite conductivity type, the drain terminal of said first and second constant current sources coupled to the source of said first and second opposite conductivity type transistors, respectively, the source terminal of said first and second constant current sources commonly coupled to said input terminal.

* * * * *